United States Patent
Cronin et al.

(10) Patent No.: US 10,680,403 B2
(45) Date of Patent: Jun. 9, 2020

(54) BULK DIRECT GAP MOS2 BY PLASMA INDUCED LAYER DECOUPLING

(71) Applicants: UNIVERSITY OF SOUTHERN CALIFORNIA, Los Angeles, CA (US); REGENTS OF THE UNIVERSITY OF CALIFORNIA, Oakland, CA (US)

(72) Inventors: Stephen B. Cronin, South Pasadena, CA (US); Rohan Dhall, Los Angeles, CA (US); Roger Lake, Riverside, CA (US); Zhen Li, Los Angeles, CA (US); Mahesh Neupane, Riverside, CA (US); Darshana Wickramaratne, Riverside, CA (US)

(73) Assignees: University of Southern California, Los Angeles, CA (US); The Regents of the University of California, Oakland, CA (US)

( * ) Notice: Subject to any disclaimer, the term of this patent is extended or adjusted under 35 U.S.C. 154(b) by 0 days.

(21) Appl. No.: 15/536,628

(22) PCT Filed: Dec. 16, 2015

(86) PCT No.: PCT/US2015/066139
§ 371 (c)(1),
(2) Date: Jun. 15, 2017

(87) PCT Pub. No.: WO2016/100538
PCT Pub. Date: Jun. 23, 2016

(65) Prior Publication Data
US 2018/0026422 A1    Jan. 25, 2018

Related U.S. Application Data

(60) Provisional application No. 62/092,602, filed on Dec. 16, 2014.

(51) Int. Cl.
*H01B 1/06* (2006.01)
*H01L 31/00* (2006.01)
(Continued)

(52) U.S. Cl.
CPC .......... *H01S 5/02415* (2013.01); *C01G 39/06* (2013.01); *C01G 41/00* (2013.01);
(Continued)

(58) Field of Classification Search
CPC .. H01B 1/00; H01B 1/06; H01L 31/00; H01L 31/0749; H01L 31/0224; H01L 31/0264; Y02P 70/521; B05D 3/141; B05D 3/145
See application file for complete search history.

(56) References Cited

U.S. PATENT DOCUMENTS 4,822,590 A * 4/1989 Morrison ................. C01B 17/20
106/DIG. 2
9,227,186 B2 * 1/2016 Kanatzidis ............... B01J 39/09
(Continued)

FOREIGN PATENT DOCUMENTS

WO    20130140181 A1    9/2013

OTHER PUBLICATIONS

Tongay et al "Tuning interlayer coupling in large-area heterostructures with CVD-grown MoS2 and WS2 monolayers", NanoLetters, 2014, 14, 3185-90. (Year: 2014).*
(Continued)

*Primary Examiner* — Mark Kopec
(74) *Attorney, Agent, or Firm* — Brooks Kushman P.C.

(57) ABSTRACT

Bulk direct transition metal dichalcogenide (TMDC) may have an increased interlayer separation of at least 0.5, 1, or 3 angstroms more than its bulk value. The TMDC may be a bulk direct band gap molybdenum disulfide (MoS2) or a bulk direct band gap tungsten diselenide (WSe$_2$). Oxygen may be between the interlayers. A device may include the
(Continued)

TMDC, such as an optoelectronic device, such as an LED, solid state laser, a photodetector, a solar cell, a FET, a thermoelectric generator, or a thermoelectric cooler. A method of making bulk direct transition metal dichalcogenide (TMDC) with increased interlayer separation may include exposing bulk direct TMDC to a remote (aka downstream) oxygen plasma. The plasma exposure may cause an increase in the photoluminescence efficiency of the TMDC, more charge neutral doping, or longer photo-excited carrier lifetimes, as compared to the TMDC without the plasma exposure.

36 Claims, 10 Drawing Sheets

(51) Int. Cl.
*H01S 5/024* (2006.01)
*H01L 31/032* (2006.01)
*C01G 39/06* (2006.01)
*C01G 41/00* (2006.01)
*H01S 5/06* (2006.01)
*H01L 33/26* (2010.01)

(52) U.S. Cl.
CPC ............ *H01B 1/06* (2013.01); *H01L 31/032* (2013.01); *H01S 5/02453* (2013.01); *H01S 5/0612* (2013.01); *C01B 2204/28* (2013.01); *H01L 33/26* (2013.01)

(56) References Cited

U.S. PATENT DOCUMENTS

| | | |
|---|---|---|
| 2005/0058406 A1 | 3/2005 | Reilly |
| 2009/0178702 A1 | 7/2009 | Pichler |
| 2011/0037033 A1 | 2/2011 | Green |
| 2012/0107488 A1 | 5/2012 | Frey |
| 2014/0008616 A1 | 1/2014 | Geim |
| 2017/0044683 A1* | 2/2017 | Cullen ................... C01B 25/00 |

OTHER PUBLICATIONS

Yun et al "Exfoliated and partially oxidized MoS2 nanosheets by one-pot reaction . . . ", small 2014, No. 12, 2319-24. (Year: 2014).*
Zhao et al "Three-dimensional MoS2 heirarchial nanoarchitectures anchored into a carbon layer . . . ", Chem. Asian J. 2013, 8, 2701-07. (Year: 2013).*
Hwang et al "MoS2 nanoplates consisting of disordered graphene-like layers . . . ", Nano Lett. 2011, 11, 4826-30. (Year: 2011).*
Brown et al "An XPS study of the surface modification of natural MoS2 following treatment in an RF-oxygen plasma", Applied Surface Science 134 (1998) 11-21. (Year: 1998).*
Zhang et al "Annbipolar MoS2 thin flake transistors", Nano Lett. 2012, 12, 1136-40.*
Manchester Nanomaterials MoS2 single crystals (6 pages) mos2crystals.com (no pub date).*
International Search Report and Written Opinion from PCT/US2015/066139, dated Feb. 26, 2016, 9 pages.

* cited by examiner

*FIG. 4A*
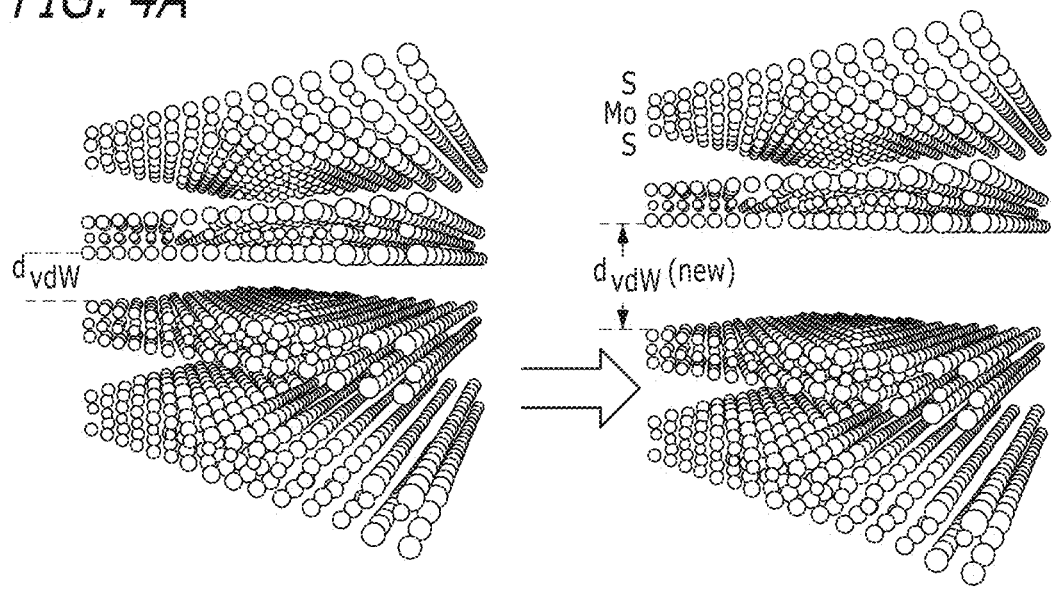
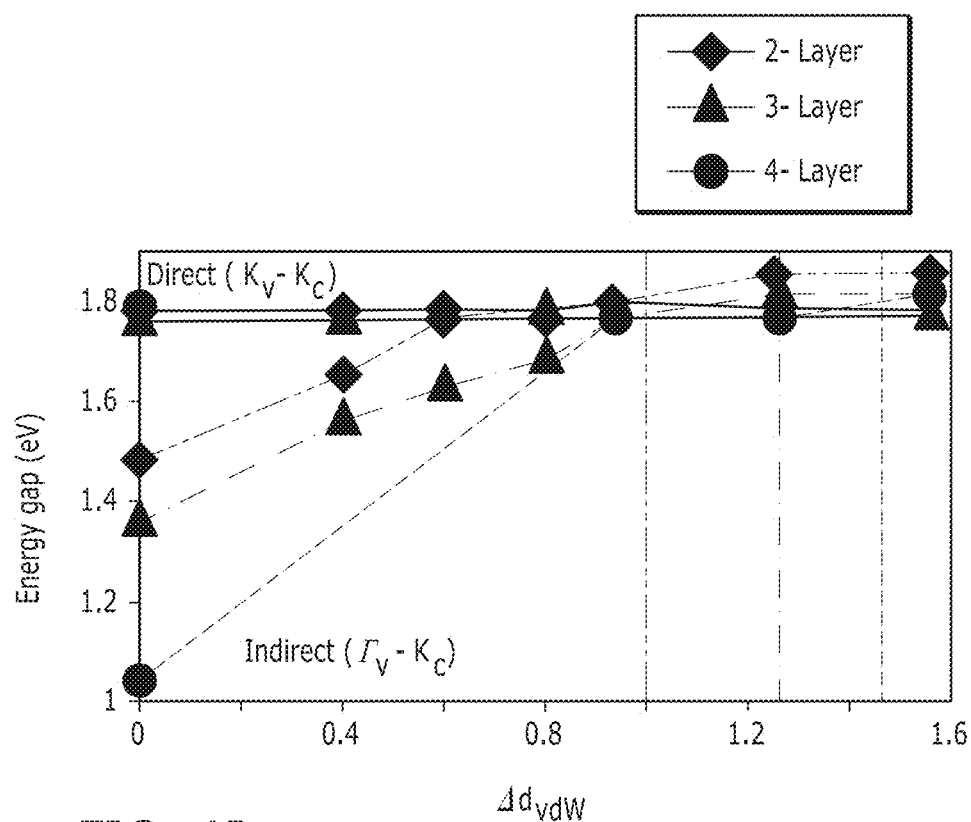
*FIG. 4B*

| Sno | Pre O₂ Treatment | | | Post O₂ Treatment | | | PL Blueshift (meV) | Δwidth (meV) | PL Enhancement |
|---|---|---|---|---|---|---|---|---|---|
| | A Peak | | | A Peak | | | | | |
| | Height (Counts) | Center (eV) | Width (meV) | Height (Counts) | Center (eV) | Width (meV) | | | |
| 1 | 6532 | 1.832 | 58 | 121040 | 1.867 | 29 | 35 | -29 | 18.5 |
| 2 | 3680 | 1.826 | 60 | 24498 | 1.863 | 40 | 37 | -20 | 6.7 |
| 3 | 3860 | 1.816 | 56 | 6600 | 1.808 | 72 | -8 | 16 | 1.7 |
| 4 | 4378 | 1.822 | 55 | 30406 | 1.856 | 44 | 35 | -10 | 6.9 |
| 5 | 7351 | 1.832 | 57 | 20096 | 1.837 | 53 | 5 | -3 | 2.7 |
| 6 | 10881 | 1.830 | 57 | 163812 | 1.861 | 33 | 31 | -24 | 15.1 |
| 8 | 11592 | 1.827 | 58 | 222173 | 1.868 | 33 | 41 | -25 | 19.2 |
| 9 | 11614 | 1.831 | 59 | 192731 | 1.866 | 35 | 35 | -24 | 16.6 |
| 10 | 7574 | 1.814 | 55 | 12338 | 1.821 | 65 | 8 | 10 | 1.6 |
| 11 | 17039 | 1.815 | 62 | 80517 | 1.848 | 41 | 33 | -21 | 4.7 |
| 12 | 13355 | 1.807 | 60 | 5461 | 1.825 | 54 | 18 | -6 | 0.4 |
| 13 | 13037 | 1.811 | 63 | 48597 | 1.865 | 31 | 54 | -32 | 3.7 |
| 14 | 16616 | 1.824 | 60 | 121148 | 1.861 | 38 | 37 | -22 | 7.3 |
| 16 | 17513 | 1.825 | 63 | 28747 | 1.869 | 43 | 44 | -20 | 1.6 |
| 17 | 23582 | 1.816 | 55 | 12098 | 1.845 | 59 | 29 | 4 | 0.5 |
| 18 | 11144 | 1.831 | 45 | 6109 | 1.832 | 61 | 1 | 16 | 0.6 |
| 19 | 19399 | 1.839 | 53 | 102603 | 1.863 | 35 | 25 | -19 | 5.3 |

FIG. 5A

| 20 | 3499 | 1.838 | 45 | 6104 | 1.836 | 52 | -2 | 7 | 1.7 |
|---|---|---|---|---|---|---|---|---|---|
| 21 | 4617 | 1.841 | 51 | 37555 | 1.863 | 33 | 22 | -18 | 8.1 |
| 23 | 3404 | 1.830 | 66 | 15016 | 1.869 | 35 | 38 | -31 | 4.4 |
| 25 | 2882 | 1.828 | 53 | 12194 | 1.876 | 34 | 48 | -19 | 4.2 |
| 27 | 4145 | 1.839 | 52 | 59454 | 1.867 | 33 | 28 | -19 | 14.3 |
| 34 | 6580 | 1.851 | 49 | 35625 | 1.873 | 27 | 22 | -22 | 5.4 |
| 37 | 2859 | 1.845 | 47 | 12304 | 1.872 | 28 | 28 | -18 | 4.3 |
| 38 | 3632 | 1.849 | 46 | 35641 | 1.872 | 27 | 23 | -18 | 9.8 |
| 39 | 4847 | 1.852 | 46 | 26829 | 1.872 | 28 | 20 | -18 | 5.5 |
| 41 | 2553 | 1.845 | 40 | 6383 | 1.883 | 35 | 38 | -5 | 2.5 |
| 43 | 3043 | 1.841 | 38 | 30866 | 1.845 | 28 | 22 | -10 | 10.1 |
| 47 | 2284 | 1.849 | 48 | 15510 | 1.871 | 31 | 28 | -17 | 6.8 |
| 49 | 3233 | 1.836 | 46 | 20282 | 1.873 | 28 | 22 | -18 | 6.3 |
| 50 | 3178 | 1.839 | 46 | 19232 | 1.874 | 29 | 21 | -17 | 6.1 |
| 51 | 1731 | 1.844 | 42 | 10963 | 1.877 | 28 | 33 | -13 | 6.3 |
| 52 | 1571 | 1.845 | 41 | 9902 | 1.878 | 29 | 33 | -12 | 6.3 |
| 53 | 2735 | 1.853 | 43 | 26206 | 1.872 | 28 | 19 | -15 | 9.6 |
| 54 | 2804 | 1.851 | 44 | 27625 | 1.872 | 28 | 21 | -16 | 9.9 |
| Avg | 7393 | 1.837 | 52 | 45905 | 1.857 | 37.9 | 26.4 | -13.9 | 6.7 |

*FIG. 5B*

| Sno | $E^1_{2g}$ Peak | | | | $A_{1g}$ Peak | | | |
|---|---|---|---|---|---|---|---|---|
| | Pre $O_2$ Treatment | | Post $O_2$ Treatment | | Pre $O_2$ Treatment | | Post $O_2$ Treatment | |
| | Centre | Width | Centre | Width | Centre | Width | Centre | Width |
| 1 | 383.8 | 3.7 | 385.2 | 4.0 | 405.3 | 8.5 | 405.1 | 5.8 |
| 2 | 382.5 | 3.9 | 383.1 | 4.2 | 405.9 | 7.1 | 405.8 | 5.8 |
| 3 | 382.3 | 3.7 | 382.9 | 3.6 | 406.6 | 5.2 | 406.6 | 6.0 |
| 4 | 383.0 | 3.9 | 382.9 | 3.6 | 406.3 | 6.9 | 404.2 | 6.0 |
| 5 | 384.0 | 4.8 | 382.7 | 4.5 | 406.1 | 8.0 | 405.0 | 6.1 |
| 6 | 384.3 | 3.5 | 384.3 | 4.4 | 407.3 | 8.2 | 404.3 | 6.7 |
| 8 | 384.2 | 4.3 | 384.9 | 4.2 | 406.0 | 7.5 | 404.5 | 6.4 |
| 9 | 384.2 | 3.4 | 382.7 | 4.0 | 406.7 | 8.0 | 405.1 | 6.5 |
| 10 | 384.1 | 3.7 | 382.8 | 3.4 | 407.6 | 6.5 | 405.0 | 6.8 |
| 11 | 383.8 | 4.4 | 383.8 | 3.6 | 405.3 | 9.7 | 404.3 | 7.0 |
| 12 | 383.4 | 4.6 | 383.0 | 3.7 | 405.2 | 10.7 | 406.6 | 5.5 |
| 13 | 382.9 | 4.1 | 383.4 | 3.5 | 406.3 | 8.5 | 405.8 | 6.0 |
| 14 | 384.1 | 4.5 | 385.8 | 3.3 | 405.9 | 9.1 | 404.6 | 8.1 |
| 16 | 384.0 | 3.9 | 385.5 | 4.4 | 405.8 | 8.7 | 405.2 | 6.6 |
| 17 | 383.9 | 4.7 | 384.4 | 3.8 | 405.9 | 8.4 | 406.2 | 6.4 |
| 18 | 383.8 | 4.4 | 383.5 | 4.2 | 407.9 | 6.0 | 407.0 | 6.0 |
| 19 | 384.5 | 4.2 | 385.6 | 4.1 | 406.4 | 8.7 | 405.3 | 6.8 |
| Avg: | 383.7 | 4.1 | 383.9 | 3.9 | 406.3 | 8.0 | 405.3 | 6.4 |

FIG. 6

BULK DIRECT GAP MOS2 BY PLASMA INDUCED LAYER DECOUPLING

CROSS-REFERENCE TO RELATED APPLICATION

This application is based upon and claims priority to U.S. provisional patent application 62/092,602, entitled "BULK DIRECT GAP MOS2 BY PLASMA INDUCED LAYER DECOUPLING," filed Dec. 16, 2014. The entire content of this application is incorporated herein by reference.

STATEMENT REGARDING FEDERALLY SPONSORED RESEARCH

This invention was made with government support under Contract No. DE-FG02-07ER46376 awarded by the Department of Energy; this invention was also made with government support under Contract Nos. 1124733 and 1128304 awarded by the National Science Foundation. The government has certain rights in the invention.

BACKGROUND

Technical Field

This disclosure relates to bulk direct transition metal dichalcogenides (TMDCs).

Description of Related Art

Two dimensional materials, such as graphene and few layer transition metal dichalcogenides (TMDCs) have attracted great research interest in the past decade, since mechanical exfoliation of these materials from their three dimensional bulk counterparts was demonstrated [K. Novoselov, D. Jiang, F. Schedin, T. Booth, V. Khotkevich, S. Morozov, A. Geim, *Proceedings of the National Academy of Sciences of the United States of America* 2005, 102, 10451]. Graphene, in particular, is of tremendous interest from a scientific standpoint due to its linear band dispersion [A. C. Neto, F. Guinea, N. Peres, K. S. Novoselov, A. K. Geim, *Reviews of Modern Physics* 2009, 81, 109], and excellent carrier mobility [K. I. Bolotin, K. Sikes, Z. Jiang, M. Klima, G. Fudenberg, J. Hone, P. Kim, H. Stormer, *Solid State Communications* 2008, 146, 351], allowing observation of phenomena such as the quantum hall effect [Y. Zhang, Y.-W. Tan, H. L. Stormer, P. Kim, *Nature* 2005, 438, 201; A. K. Geim, K. S. Novoselov, *Nature Materials* 2007, 6, 183; V. Singh, M. M. Deshmukh, *Physical Review B* 2009, 80, 081404], non-adiabatic phonon anomalies [S. Pisana, M. Lazzeri, C. Casiraghi, K. S. Novoselov, A. K. Geim, A. C. Ferrari, F. Mauri, *Nature Materials* 2007, 6, 198], and Dirac Fermion nature of electrons [S. Pisana, M. Lazzeri, C. Casiraghi, K. S. Novoselov, A. K. Geim, A. C. Ferrari, F. Mauri, *Nature Materials* 2007, 6, 1988; J. Tsang, M. Freitag, V. Perebeinos, J. Liu, P. Avouris, *Nature Nanotechnology* 2007, 2, 725]. However, due to its gapless dispersion, its utility in the field of optoelectronics may be limited.

Transition metal dichalcogenides, such as $MoS_2$, $WS_2$, and $WSe_2$, on the other hand, are found to exist in similar layered structures and exhibit finite band gaps in the visible wavelength range [Q. H. Wang, K. Kalantar-Zadeh, A. Kis, J. N. Coleman, M. S. Strano, *Nature Nanotechnology* 2012, 7, 699; M. Chhowalla, H. S. Shin, G. Eda, L.-J. Li, K. P. Loh, H. Zhang, *Nature Chemistry* 2013, 5, 263; K. F. Mak, C. Lee, J. Hone, J. Shan, T. F. Heinz, *Physical Review Letters* 2010, 105, 136805].

TMDCs have traditionally been used as lubricants and host materials for intercalation compounds [M. Dresselhaus, *MRS Bulletin* 1987, 12, 24; S. M. Whittingha, *Intercalation chemistry, Elsevier,* 2012]. The optical properties of these TMDCs may vary significantly with layer thickness [K. F. Mak, C. Lee, J. Hone, J. Shan, T. F. Heinz, *Physical Review Letters* 2010, 105, 136805]. While monolayer $MoS_2$ and $WSe_2$ are direct band gap materials, their few layer counterparts are indirect semiconductors, which show a greatly suppressed photoluminescence (PL) [K. F. Mak, C. Lee, J. Hone, J. Shan, T. F. Heinz, *Physical Review Letters* 2010, 105, 136805; A. Splendiani, L. Sun, Y. Zhang, T. Li, J. Kim, C.-Y. Chim, G. Galli, F. Wang, *Nano Letters* 2010, 10, 1271]. Consequently, most recent research efforts have been directed towards monolayer TMDCs. Monolayers, while direct band gap, have small optical densities, which may limit their potential use in practical devices.

SUMMARY

Bulk direct transition metal dichalcogenide (TMDC) may have an increased interlayer separation of at least 0.5, 1, or 3 angstroms more than its bulk value. The TMDC may be a bulk direct band gap molybdenum disulfide (MoS2) or a bulk direct band gap tungsten diselenide ($WSe_2$). Oxygen may be between the interlayers. A device may include the TMDC, such as an optoelectronic device, such as an LED, solid state laser, a photodetector, a solar cell, a FET, a thermoelectric generator, or a thermoelectric cooler.

A method of making bulk direct transition metal dichalcogenide (TMDC) with increased interlayer separation may include exposing bulk direct TMDC to a remote (aka downstream) oxygen plasma. The plasma exposure may cause an increase in the photoluminescence efficiency of the TMDC, more charge neutral doping, or longer photo-excited carrier lifetimes, as compared to the TMDC without the plasma exposure.

These, as well as other components, steps, features, objects, benefits, and advantages, will now become clear from a review of the following detailed description of illustrative embodiments, the accompanying drawings, and the claims.

BRIEF DESCRIPTION OF DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

FIG. 1(c) illustrates photoluminescence spectra before and after oxygen plasma treatment, plotted on different Y scales, highlighting the blue shift of the A exciton, the narrowing of the spectral linewidth, and the emergence of the asymmetry in PL lineshape after plasma treatment at 300K. FIG. 1(d) is an inset that shows the emergence of a distinct, low energy peak at 100K. The relative intensity of the low energy PL peak is shown as a function of temperature.

FIG. 1(c) illustrates Raman spectra before and after plasma treatment. No significant shift in the Raman peaks is observed, although the Raman intensity for both peaks is reduced, and a slight narrowing of the peaks is observed.

FIG. 4(a) illustrates atomistic structure of the 4L-$MoS_2$ with the equilibrium vdW gap, $d_{vdw}$, and the modified vdW gap, $d_{vdw}$ (new). FIG. 4(b) illustrates direct gap (solid) and indirect gap (dotted) energy transitions for 2L, 3L and 4L $MoS_2$ for a range of increases in the vdW gap ($\Delta d_{vdw}$). The dotted vertical lines indicate the indirect to direct transition vdW gaps for 2L (green), 3L (blue), and 4L (red) $MoS_2$.

FIGS. 5(a) and 5(b) illustrate different parts of a table that provides a list of PL peak positions and linewidths measured before and after oxygen plasma treatment for 35 $MoS_2$ flakes measured in this study.

FIG. 6 is a table of Raman scattering peak position and width for the $E^1_{2g}$ and $A_{1g}$ Raman modes for 17 flakes measured before and after optimized oxygen plasma treatment.

DETAILED DESCRIPTION OF ILLUSTRATIVE EMBODIMENTS

Figure 1:
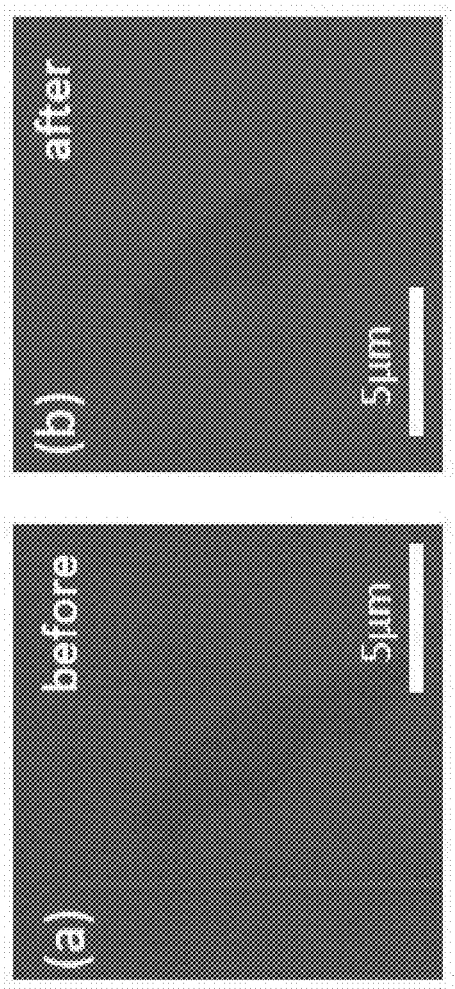
FIG. 1 illustrates an optical microscope image of a few layer $MoS_2$ flake (a) before and (b) after 3 minutes of oxygen plasma treatment.
Figure 1:
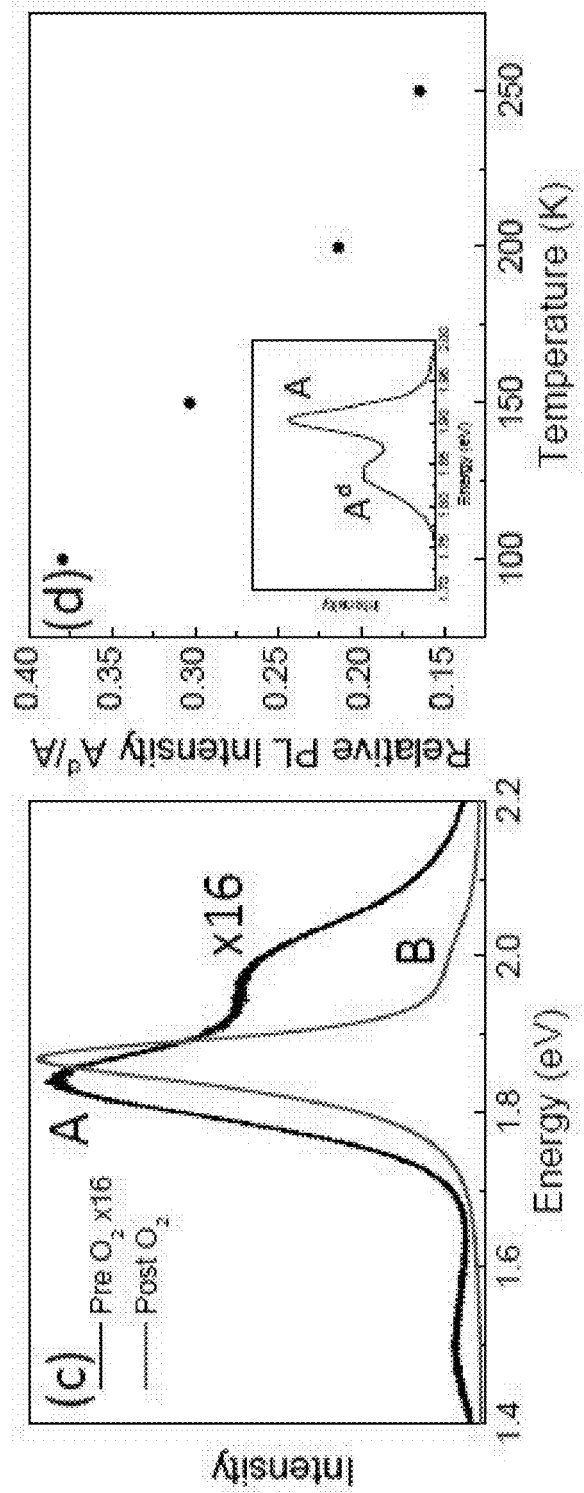

Illustrative embodiments are now described. Other embodiments may be used in addition or instead. Details that may be apparent or unnecessary may be omitted to save space or for a more effective presentation. Some embodiments may be practiced with additional components or steps and/or without all of the components or steps that are described.

A robust method for engineering the optoelectronic properties of many-layer $MoS_2$ using low energy oxygen plasma treatment is now described.

Gas phase treatment of $MoS_2$ with oxygen radicals generated in an upstream $N_2$—$O_2$ plasma may enhance the photoluminescence (PL) of many-layer, mechanically exfoliated $MoS_2$ flakes by up to 20 times, without reducing the layer thickness of the material. A blue shift in the photoluminescence spectra and narrowing of linewidth may be consistent with a transition of $MoS_2$ from indirect to direct band gap material. Atomic force microscopy and Raman spectra reveal that the flake thickness may actually increase as a result of the plasma treatment, indicating an increase in the interlayer separation in $MoS_2$. Ab-initio calculations reveal that the increased interlayer separation may be sufficient to decouple the electronic states in individual layers, leading to a transition from an indirect to direct gap semiconductor. With optimized plasma treatment parameters, enhanced PL signals for 32 out of 35 many-layer $MoS_2$ flakes (2-15 layers) tested were observed, indicating this method may be robust and scalable. Monolayer $MoS_2$, while direct band gap, may have a small optical density, which may limits it potential use in practical devices. The results presented here may provide a material with the direct band gap of monolayer $MoS_2$, without reducing sample thickness, and hence optical density.

A gentle oxygen plasma treatment may produce a direct band gap transition in many-layer $MoS_2$. The band structure of $MoS_2$ with more than 4 layers in thickness is almost identical to that of bulk $MoS_2$, and flakes thicker than that are considered "many-layer" in this disclosure. The data gathered was obtained from samples with thicknesses up to 15 layers (approximately 12 nm), and approximately 5-15 μm in size. This transition was studied using photoluminescence spectroscopy, Raman Spectroscopy, atomic force microscopy (AFM), and electron energy loss spectroscopy (EELS). Ab-initio calculations provide insight into the layer decoupling mechanism responsible for this indirect to direct gap transition.

Low power, remote (or downstream) plasma treatment has been effectively used to remove hydrocarbon impurities in situations where the sample itself is known to be susceptible to damage by fast moving ionic species [B. Anthony, L. Breaux, T. Hsu, S. Banerjee, A. Tasch, *Journal of Vacuum Science & Technology B: Microelectronics and Nanometer Structures* 1989, 7, 621]. For example, remote plasma has been used to selectively etch away metallic carbon nanotubes and surface contaminants, to enable fabrication of semiconducting single wall carbon nanotube field effect transistors [G. Zhang, P. Qi, X. Wang, Y. Lu, X. Li, R. Tu, S. Bangsaruntip, D. Mann, L. Zhang, H. Dai, *Science* 2006, 314, 974]. An XEI Evactron Soft Clean plasma cleaner may be used, in which the plasma is generated by flowing room air past an electrode supplied with 20 W of RF power at 200 mTorr. The sample is placed a certain distance (6-10 cm) away from the plasma source, and ionized oxygen atoms diffuse towards the sample chamber with low kinetic energies. Samples were exposed to the $O_2$ plasma for about 3 minutes. While typical plasma cleaners used in semiconductor fabrication operate using a "sputtering" mechanism, wherein the sample is bombarded with ions carrying significant kinetic energy, remote plasma cleaners rely mainly on the chemical reactivity of the ionized oxygen to remove surface contaminants. Despite the presence of nitrogen in the gas mixture, the plasma itself mainly consists of oxygen radicals, since the $N_2$ molecule has a much higher bonding energy.

FIGS. 1(a) and 1(b) show optical microscope image of a mechanically exfoliated flake of $MoS_2$ on an oxidized silicon wafer. The photoluminescence (PL) spectra of these flakes are obtained using a 532 nm excitation laser focused to a 0.5 μm spot, attenuated in power to 10 μW/μm², to minimize sample heating. The PL spectra of the same $MoS_2$ flake taken before and after three minutes of oxygen plasma treatment are shown in FIG. 1(c). The two peaks labeled A and B correspond to transitions between the conduction band and the two (spin-orbit split) valence bands at the K point in the Brillouin zone. In this particular case, there is a sixteen fold enhancement of the PL intensity after the oxygen plasma treatment, along with significant (about 46%) narrowing of the spectral linewidth, indicating an improvement in material quality. The PL peak also shifts from typical energies between 1.81-1.83 eV before $O_2$ plasma to 1.86 eV after the plasma treatment. This is consistent with the observations of Mak et. al on suspended, monolayer, direct gap $MoS_2$ [K. F. Mak, C. Lee, J. Hone, J. Shan, T. F. Heinz, *Physical Review Letters* 2010, 105, 136805].

FIGS. 5(a) and 5(b) illustrate different parts of a table that provides a list of PL peak positions and linewidths measured before and after oxygen plasma treatment for 35 $MoS_2$ flakes measured in this study. Enhanced PL intensities were observed for 32 out of 35 many-layer $MoS_2$ flakes tested, indicating this method is robust and scalable.

Figure 2:
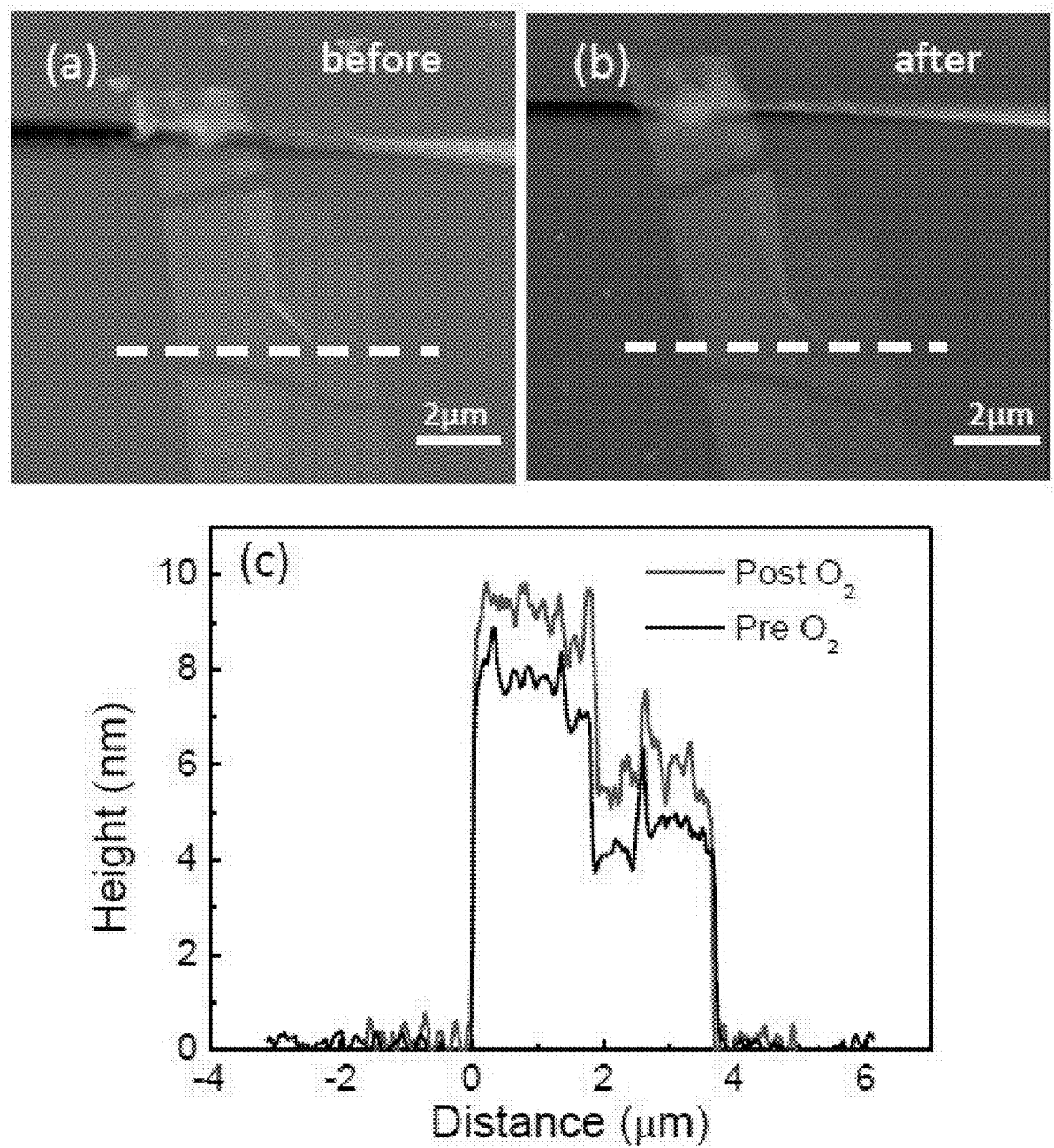
FIG. 2 illustrates AFM (height) images of a $MoS_2$ flake taken (a) before and (b) after a 3 minute oxygen plasma treatment (Plotted on different color scales). The step height profiles along the dashed lines are shown in (c). A significant increase in sample thickness, of about 2 nm, is observed after plasma treatment.

The large intensity enhancement and blueshift of the PL peak observed after oxygen treatment is not the result of a reduction in the layer thickness of the $MoS_2$, as shown by AFM and Raman measurements. The AFM images taken before and after oxygen treatment, surprisingly, reveal an increase in flake thickness, as shown in FIG. 2c. The error in height measurements can be estimated from the standard deviation of the measured profile on the underlying $SiO_2$ substrate, which is found to be 2.4 Å both before and after plasma treatment. For the AFM data shown in FIG. 2c, the step height along the white dashed lines in FIGS. 2a and 2b increases by about 20±5 Å due to the treatment with oxygen plasma. The 20 Å increase in the film thickness, distributed across the 9 nm $MoS_2$ film consisting of 11 to 13 monolayers, corresponds to an average increase in each van-der-Waals (vdW) gap of 1.5 Å to 1.8 Å. Density functional theory calculations described below show that this increased interlayer distance is sufficient to cause an indirect to direct band gap transition suggesting that the enhanced PL observed is the result of plasma-assisted layer decoupling of the $MoS_2$ lattice.

Figure 3:
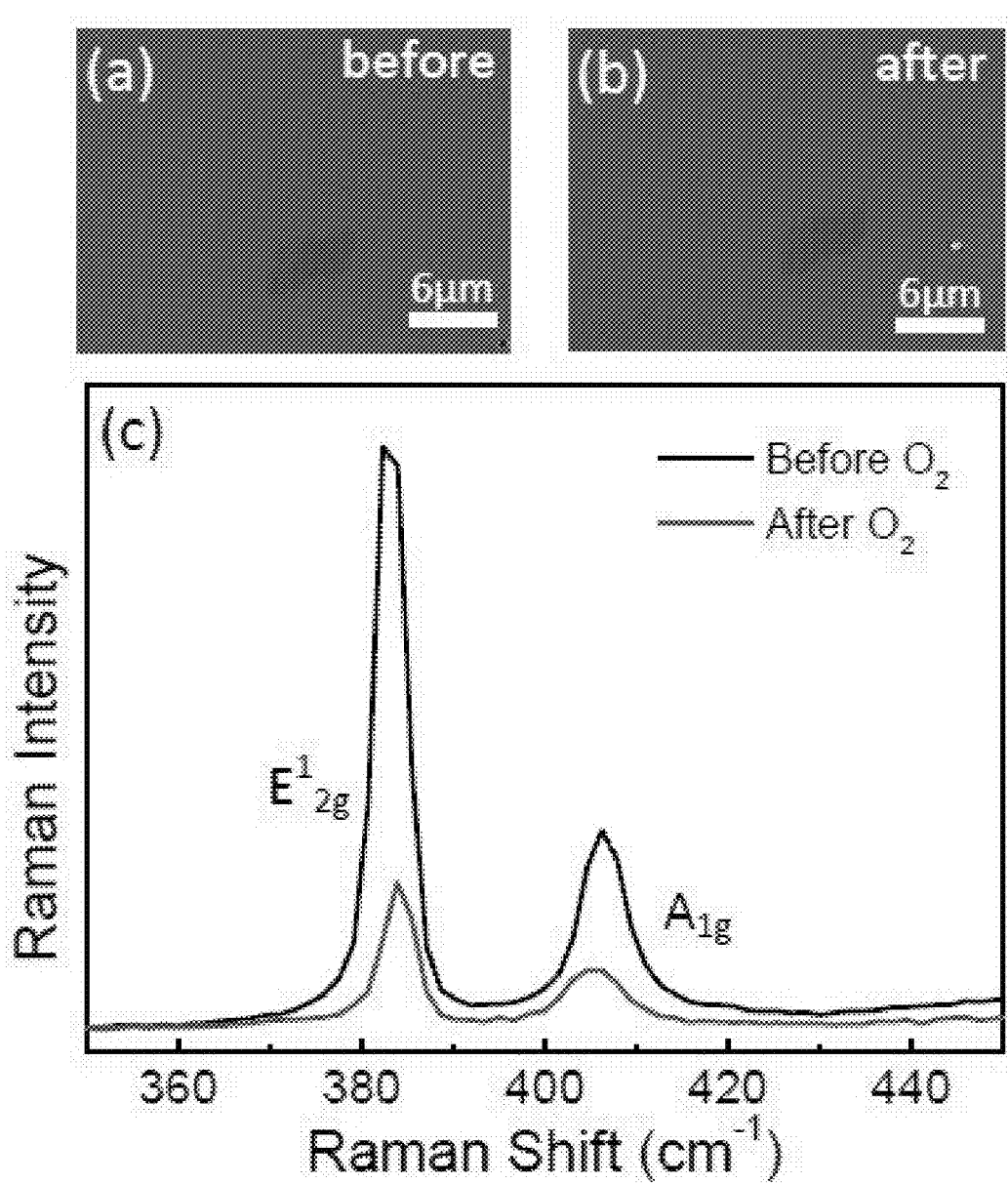
FIG. 3 illustrates an optical microscope image of a few layer $MoS_2$ flake (a) before and (b) after 3 minutes of oxygen plasma treatment.

Raman spectra taken before and after oxygen treatment also indicate that no thinning of the sample is occurring. In FIG. 3c, the Raman spectra of an $MoS_2$ flake exhibit two peaks corresponding to the $E^1_{2g}$ (in plane) and $A_{1g}$ (out of plane) vibrational modes [C. Lee, H. Yan, L. E. Brus, T. F. Heinz, J. Hone, S. Ryu, *ACS Nano* 2010, 4, 2695]. The separation between these two peaks provides a good measure of the layer thickness of the material, varying from 19 $cm^{-1}$ for monolayer to 25 $cm^{-1}$ for N-layer (N>6) $MoS_2$ [C. Lee, H. Yan, L. E. Brus, T. F. Heinz, J. Hone, S. Ryu, *ACS Nano* 2010, 4, 2695]. The Raman spectra of 17 flakes of $MoS_2$ were studied, before and after $O_2$ plasma treatment. On average, the separation between the two Raman peaks reduced from 22.6 $cm^{-1}$ to 21.4 $cm^{-1}$ after plasma treatment, indicating that the flakes are still multilayer $MoS_2$. We consistently see a downshift in the $A_{1g}$ (out of plane) Raman mode position and a narrowing of the Raman linewidth. However, no consistent and systematic change of the in plane ($E^1_{2g}$) mode is observed, which is also seen to upshift slightly at times. These results indicate that the intralayer spring constant is unaffected by the plasma treatment, and the interlayer "spring constant" is consistently weakened (albeit by a small amount). This shows that a mere flake thinning is not the mechanism responsible for the enhanced PL intensity observed after $O_2$ plasma treatment. On the contrary, an increase in the flake thickness shown by AFM, and the softening of the interlayer spring constant seen in the Raman spectra, point to a mechanism in which the interlayer van der Waals coupling is weakened. The reduction in Raman intensity is a possible consequence of the change in lattice symmetry, which determines the matrix elements and selection rules for Raman active vibrational modes. A tabulated summary of the Raman data is given in FIG. 6. While Raman spectroscopy can only differentiate single layer, bilayer and trilayer $MoS_2$ reliably, the Raman data excludes the possibility that the flake thickness has actually been reduced to monolayer $MoS_2$.

To explain the observed change in the PL peak with oxygen intercalation, the emergence of the PL peak at 1.8 eV is attributed to an increase in the van-der-Waals (vdW) gap between the adjacent layers of $MoS_2$. To support this argument, the electronic band structure of bilayer (2L) was calculated, trilayer (3L) and quad-layer (4L) $MoS_2$, as shown in FIG. 4(b), for a range of vdW gap distances between the adjacent layers. Calculations are based on first-principles density functional theory (DFT) using the projector augmented wave method as implemented in the software package VASP [G. Kresse, J. Hafner, *Physical Review B* 1993, 47, 558]. The screened Heyd-Scuseria-Ernzerhof (HSE) hybrid functional has been employed for this study [J. Heyd, G. E. Scuseria, M. Ernzerhof, *The Journal of Chemical Physics* 2003, 118, 8207]. Spin-orbit coupling was included self-consistently within the band structure calculations. The HSE calculations incorporate 25% short-range Hartree Fock exchange, and the screening parameter is set to 0.4 Å [F. Zahid, L. Liu, Y. Zhu, J. Wang, H. Guo, *AIP Advances* 2013, 3, 052111]. A Monkhorst-Pack scheme was adopted to integrate over the Brillouin zone with a k-mesh 9×9×1 for the bilayer and trilayer structures. The k-mesh was reduced to a converged 4×4×1 grid for the quad-layer structure HSE calculations. A plane-wave basis kinetic energy cutoff of 300 eV was used. The lattice constants for the bilayer and trilayer structures are obtained from our prior calculations on the bulk structure of $MoS_2$ that have been optimized with vdW interactions accounted for using a semi-empirical correction to the Kohn-Sham energies [D. Wickramaratne, F. Zahid, R. K. Lake, *The Journal of Chemical Physics* 2014, 140, 124710]. A vacuum spacing of 15 Å is added along the z-axis for all the structures. The atomic coordinates for each structure were optimized in all directions using the DFT-D2 dispersion corrections [S. Grimme, *Journal of Computational Chemistry* 2006, 27, 1787] until all the interatomic forces are below 0.01 eV/Å. The default level of theory in all calculations is HSE with spin-orbit coupling. Only deviations from the defaults are noted. The equilibrium vdW gap, $d_{vdw}$, is 3.12 Å for the 2L, 3L and 4L $MoS_2$ structures.

The valence band edge, $\Gamma_v$, is composed of 28% $p_z$ orbitals from the S atoms and 67% $d_z^2$ orbitals from Mo atoms. The valence bands at $K_v$ contain no $d_z^2$ or $p_z$ components and are primarily composed of $d_x^2$, and $d_{xy}$ orbitals. Because of the large $p_z$ orbital component of the S atoms, the $\Gamma_v$ valley has the largest interlayer coupling and is, therefore, most sensitive to the presence of adjacent layers. When two monolayers are brought together, the $\Gamma_v$ valleys of the two layers couple and split. At the equilibrium interlayer distance of 3.12 Å, the energy splitting is 620 meV. The corresponding energy splitting at $K_v$ due to interlayer coupling is 74 meV. Thus, the interlayer coupling causes the $\Gamma_v$ valley to rise above the $K_v$ valley as two monolayers are brought into close proximity.

The orbital composition of the conduction band at $K_c$ is 67% $d_z^2$ with no $p_z$ component. The next closest conduction band valley is at $\Sigma_c$ composed of 36% $d_z^2$ and a minor contribution from the $p_z$ orbitals of the S atoms. The conduction band at $K_c$ has no $p_z$ components from the sulfur atoms. Thus, the $K_c$ valley is only weakly affected by the proximity of an adjacent layer, and as two monolayers are brought together, the conduction band remains at $K_c$ for the 2L, 3L and 4L structures.

The electronic band structures for 2L, 3L, and 4L MoS$_2$ are calculated for a range of vdW gap distances starting from the equilibrium value of $d_{vdw}$=3.12 Å and increasing it up to a maximum of 1.6 times the equilibrium value. When the vdW gap is increased by a factor of 1.6 in a 2L structure, the energy of $\Gamma_b$ decreases by 470 meV with respect to the vacuum energy. The $K_v$-$K_c$ direct gap transition changes by only 2 meV. A crossover from an indirect to direct gap transition occurs when the equilibrium vdW gap in 2L, 3L, and 4L MoS$_2$ is increased by 1.0 Å, 1.13 Å, and 1.45 Å, respectively. At these separation distances the direct gap and indirect gap energies are equal. With further increases in the vdW gap the band gap becomes direct. The direct gap $K_v$-$K_c$ and the indirect gap $\Gamma_v$-$K_c$ band gap energies calculated using DFT are illustrated for the 2L, 3L, and 4L structures in FIG. 4b. The calculated increases in the vdW gaps that produce the indirect to direct transition are consistent with the experimentally measured increase in the film thickness shown in FIG. 2(c).

Figure 8:
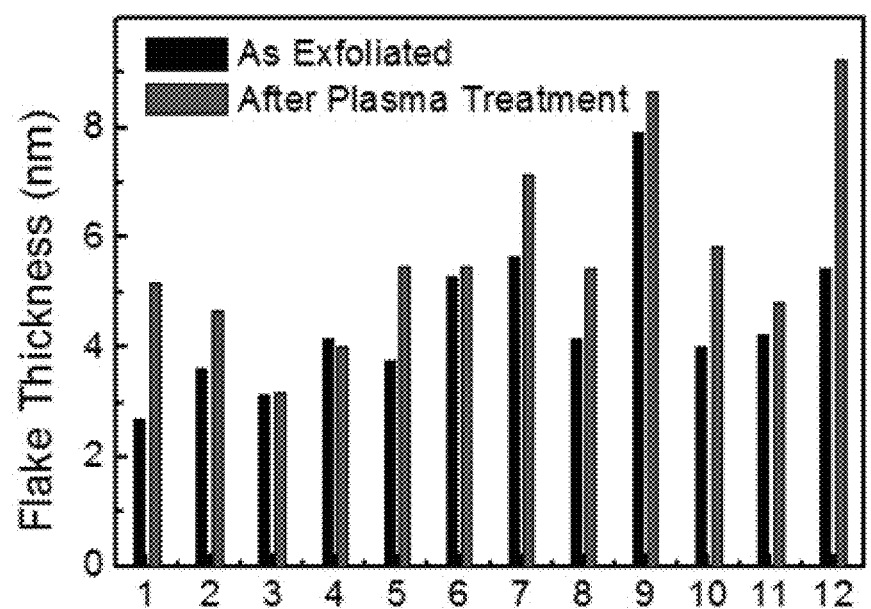
FIG. 8 shows the increase in flake thickness for 12 different many-layer $MoS_2$ flakes.
Figure 9:
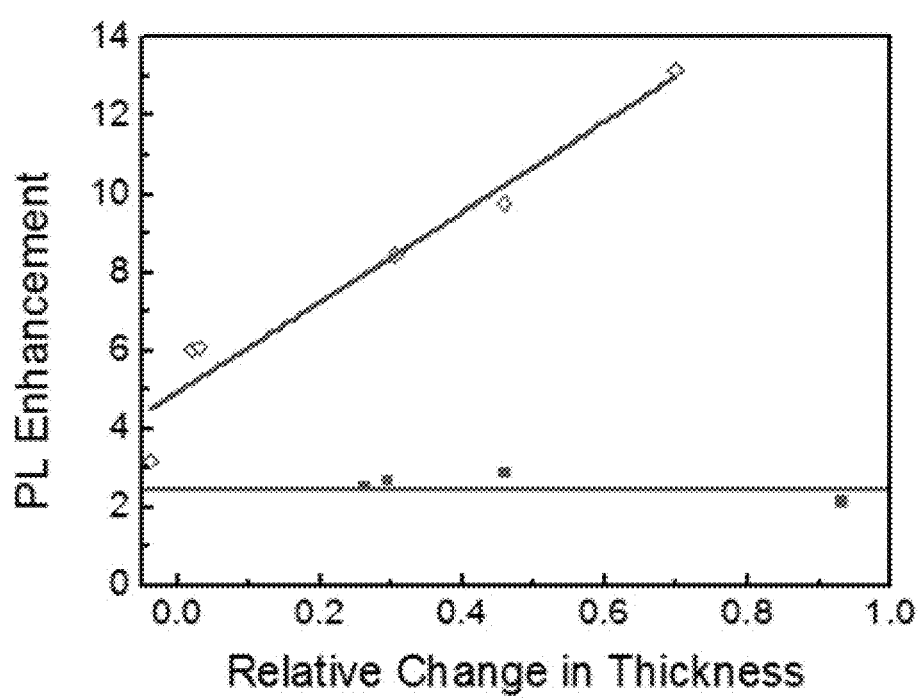
FIG. 9 illustrates correlation of the observed PL enhancement with the relative increase in interlayer separation ($\Delta h/h$) showing trend lines corresponding to two types of samples with uniformly intercalated layers (blue) and top-layer only intercalation (red).

The consistency between the increase in interlayer separation revealed by AFM and Raman spectroscopy, and the corresponding increase in PL yields with theoretical calculations point to a mechanism in which exposure to oxygen plasma disturbs the interlayer van der Waals bonding. One scenario which could lead to this effect is intercalation of van der Waals gap of MoS$_2$ by a foreign species during expose to oxygen plasma. Electrochemical techniques, using liquid phase solvents, have been shown to enable intercalation of small chemical species (such as lithium ions) into lattices of layered materials like graphite [Z. Shu, R. McMillan, J. Murray, *Journal of The Electrochemical Society* 1993, 140, 922]. More recently, such methods have been used to completely separate the individual layers of two dimensional materials [V. Nicolosi, M. Chhowalla, M. G. Kanatzidis, M. S. Strano, J. N. Coleman, *Science* 2013, 340; J. N. Coleman, M. Lotya, A. O'Neill, S. D. Bergin, P. J. King, U. Khan, K. Young, A. Gaucher, S. De, R. J. Smith, *Science* 2011, 331, 568; Y. Hernandez, V. Nicolosi, M. Lotya, F. M. Blighe, Z. Sun, S. De, I. McGovern, B. Holland, M. Byrne, Y. K. Gun'Ko, *Nature Nanotechnology* 2008, 3, 563; G. Eda, H. Yamaguchi, D. Voiry, T. Fujita, M. Chen, M. Chhowalla, *Nano Letters* 2011, 11, 5111]. Layer separation is achieved by completely saturating the interlayer gaps in the host TMDC lattice with guest species, followed by mechanical agitation. From intercalation chemistry, we know that a guest species need not distribute itself evenly in the interlayer gaps of the host lattice. It is common to find staging of guest atoms, which is the occupation of every other interlayer gap [M. Dresselhaus, *MRS Bulletin* 1987, 12, 24; S. M. Whittingha, *Intercalation chemistry, Elsevier,* 2012; G. Wiegers, *Physica B+C* 1980, 99, 151]. Similarly, the guest species may cover only a fraction of the area in any one interlayer gap, leaving the host atomic layers weakly bound to one another. It would be expected, that completely saturating the interlayer spaces with guest species would lead to complete exfoliation of MoS$_2$. Overexposure of MoS$_2$ flakes to the plasma treatment may sometimes leads to complete removal of the flakes. However, unlike previous liquid based exfoliation methods, by controlling the plasma treatment parameters, only partial coverage of the interlayer spaces may be ensured, and hence prevent complete exfoliation. FIG. 8 shows the increase in flake thickness for 12 different many-layer MoS$_2$ flakes. 11 out of 12 flakes show an increase in the thickness after plasma treatment. 10 of these 12 samples showed an increase in the PL intensity. FIG. 9 shows the PL enhancement factor plotted as a function of the change in flake thickness for these 10 samples.

In MoS$_2$, such an engineered system may be tremendously advantageous for device applications. By reducing the inter-planar overlap of electronic states in many-layer MoS$_2$, one would expect the material to behave as a stack of isolated "monolayer" MoS$_2$, each with a direct band gap desirable for optoelectronic applications. One of the challenges in creating an optoelectronic device such as a p-n junction from a "monolayer" crystal arises from local fluctuations in charge densities due to surface impurities, which precludes controlled doping of the material. The direct band gap many-layer crystal obtained in this work would be far less susceptible to surface effects. Furthermore, many layer, direct band gap MoS$_2$ would enable cross plane p-n junctions to be fabricated with finite space charge regions, as in conventional p-n junctions. The applicability of this method in decoupling layers is likely limited for significantly thicker flakes, due to the kinetics of the intercalation process. The intercalation of foreign species appears to be quite stable, and plasma-treated MoS$_2$ does not revert to its indirect form over time. The presence of foreign species, however, significantly destabilizes the interlayer van der Waals bonding in the MoS$_2$, and some delamination of the MoS$_2$ is observed when stored under ambient conditions over the span of a few weeks. By applying various strategies for hermetic sealing, this instability may be overcome in practical device applications.

Figure 10:
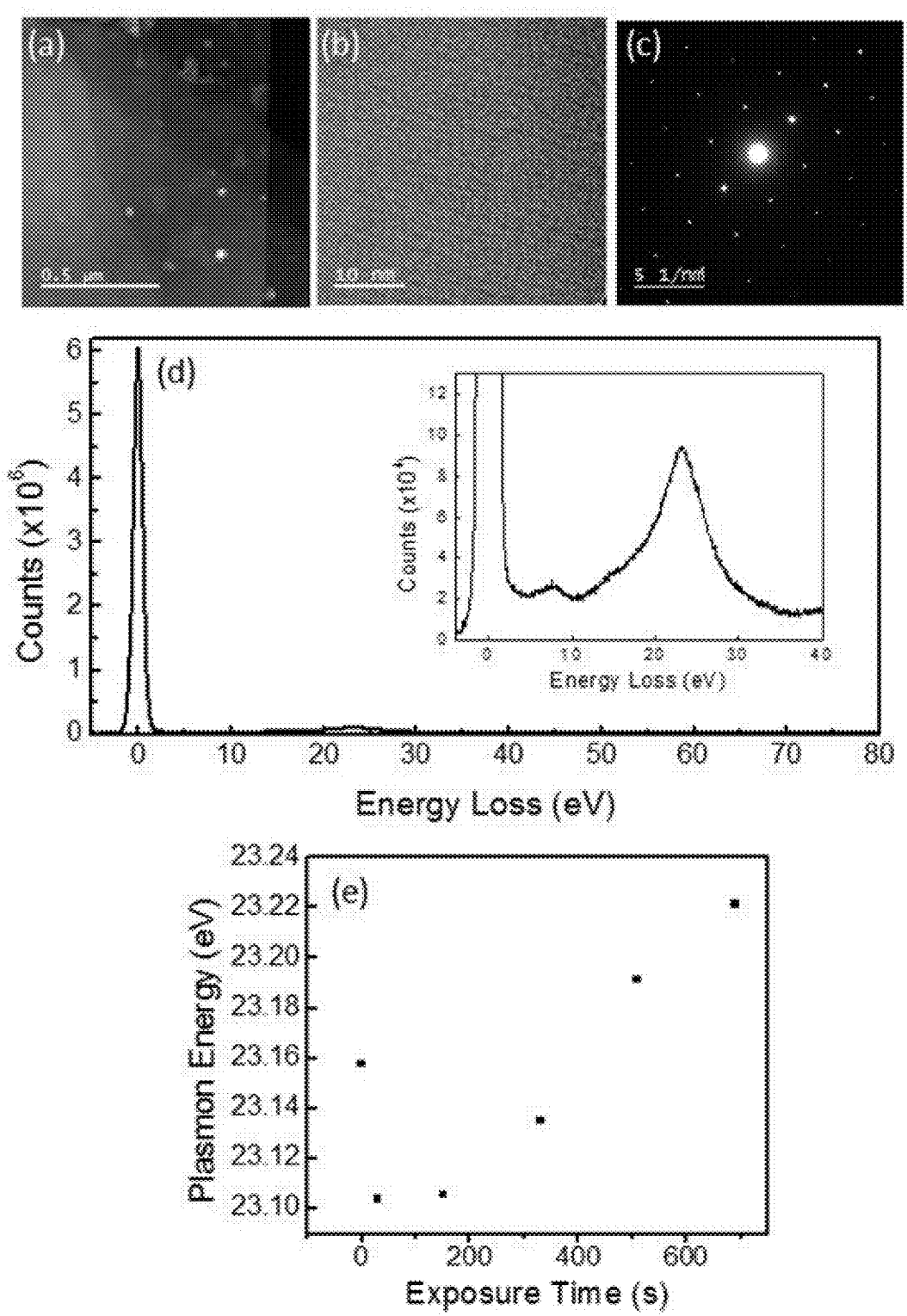
FIGS. 10(a) and 10(b) illustrate the structural quality of the flake was confirmed using high resolution imaging and electron diffraction at 200 kV.
FIG. 10(c) illustrates an electron diffraction pattern.
FIG. 10(d) illustrates an EELS spectrum.
FIG. 10(e) illustrates the shift of the plasmon loss peak is plotted as a function of the oxygen plasma exposure time.

Another aspect of the oxygen plasma treatment, evident from the AFM images in FIGS. 7(a) and 7(b), is the dramatic reduction in surface contaminants arising from lithographic and exfoliation residues, which is expected to contribute to the dramatic increase in PL efficiency shown in FIG. 1(c). The plasma cleaning treatment also leads to a consistent narrowing of the PL linewidth, as evident in FIG. 1c. While the intensity of the A exciton luminescence is greatly enhanced, the intensity of the B exciton is actually diminished. This is also to be expected, since optically generated higher energy (B) excitons, due to their increased lifetimes, now have more time to find a decay path to the more energetically favorable (A) state before radiative recombination. This transition from B to A is disallowed in defect free MoS$_2$, since those states are orthonormal. However, oxygen plasma treatment perturbs the crystal potential, thereby allowing this transition, and explaining the reduction of B exciton luminescence. This observed blue shift in the PL peak is consistent with previous studies on suspended MoS$_2$ [K. F. Mak, C. Lee, J. Hone, J. Shan, T. F. Heinz, *Physical Review Letters* 2010, 105, 136805] and MoS$_2$ passivated by ionic liquids [Z. Li, S.-W. Chang, C.-C. Chen, S. B. Cronin, 2014]. The lineshape of the observed luminescence from the A exciton is found to be asymmetric, with a significant shift of the spectral weight towards the low energy side, as shown in FIG. 1c. This apparent asymmetry is the result of the emergence of a peak near the low energy shoulder of the A excitonic peak. Photoluminescence spectra taken at cryogenic temperatures provide insight into the underlying nature of this lineshape asymmetry. Here, the lower energy peak may be distinguished clearly, shown in the inset of FIG. 1(d). As shown recently by Korn et al. [T. Korn, S. Heydrich, M. Hirmer, J. Schmutzler, C. Schüer,

*Applied Physics Letters* 2011, 99, 102109], this peak (labeled $A^d$) is characteristic of the formation of a localized excitonic state, due to the creation of defects, or alternatively, the emergence of disorder. FIG. 1d shows the relative intensity of this low energy $A^d$ peak to the dominant A exciton peak, as a function of sample temperature. At room temperature, the excitonic state is no longer well localized, leading to a diminished intensity of the observed disorder related peak. When higher RF power plasmas are used, the emergence of disorder and defects as indicated by the sub-band gap $A^d$ peak in the PL spectra at room temperature are observed. However, under the optimized conditions used in this work, any $A^d$ peak in the PL spectra at room temperature is not observed. HRTEM and EELS analysis presented in FIGS. 10(a-e). FIGS. 10(a-c) also does not reveal significant flake deterioration, even after several minutes of exposure to remote oxygen plasma. As a consequence of disorder, one would expect the PL intensity to vary spatially. However, in 2D PL maps, inhomogeneity of PL intensity over a $MoS_2$ flake of uniform thickness was not detected. This may be because both the exciton radius, and the size of any defect state, are expected to be at least an order of magnitude smaller than the diffraction limit. While interpretation of far field optical spectroscopy, as presented in this disclosure, sheds some light on the possible mechanisms at play, more direct evidence may be found by near field optical studies. Similarly, a more detailed ab-initio calculation by including guest species in the van der Waals gap would prove to be useful.

A recent report in literature [H. Nan, Z. Wang, W. Wang, Z. Liang, Y. Lu, Q. Chen, D. He, P. Tan, F. Miao, X. Wang, *ACS Nano* 2014] also observes similar PL enhancement, attributed to formation of Mo—O bonds based on XPS signals. However, XPS measurements are ill suited to flakes of $MoS_2$, as the illuminated spot size is typically 15-20 µm, which is considerably larger than the typical flake size. Such a bond formation may have a dramatic impact on the Raman spectrum, due to a change in the atomic mass. No such shift was observed, hence ruling out Mo—O bond formation.

In summary, an indirect to direct band gap transition in many-layer $MoS_2$ has been demonstrated using a simple, scalable oxygen plasma induced process. The PL efficiency is found to increase due to the decoupling of electronic states in individual layers. Furthermore, a significant narrowing in spectral linewidth is observed, indicating an increase in the exciton lifetime in $MoS_2$, due to removal of surface contaminants. The mechanism for the photoluminescence enhancement relies on incomplete filling (or intercalation) of the interlayer gap with a guest species, with a very slight change in doping. While the increase in interlayer separation confines the carriers in two dimensions, the possible creation of defects in $MoS_2$ likely gives rise localized excitonic states with longer lifetimes. This simple processing step could have vast implications for future generations of optoelectronic devices by providing direct band gap transition metal dichalcogenides with large optical densities.

The table in FIGS. 5A and 5B show photoluminescence peak height, position, and linewidth for the A exciton peak for 35 flakes of $MoS_2$ before and after $O_2$ plasma treatment. The narrowing in peak linewidth and blueshift of peak position are also listed. Overall, 32 out of 35 flakes show an enhanced PL intensity. The last line indicates on average PL is enhanced 6.7 times, blueshifted by 26.4 meV, and the peak linewidth reduces by 14 meV due to the plasma treatment.

The large standard deviation in table in FIGS. 5A and 5B is to be expected since the study investigates plasma induced decoupling in a variety of layer thicknesses of the "as-exfoliated" flakes. Furthermore, the surface conditions vary from sample to sample in mechanically exfoliated flakes, due to a lack of control over surface morphology and residues. This is apparent in the wide spread of the PL emission energies (1.81-1.86 eV) before oxygen plasma treatment. After treatment with $O_2$ plasma, however, a much more narrow distribution of PL emission energies (1.86-1.88 eV) is observed, particularly for flakes showing substantial PL enhancement.

FIG. 6 is a table of Raman scattering peak position and width for the $E^1_{2g}$ and $A_{1g}$ Raman modes for 17 flakes measured before and after optimized oxygen plasma treatment. No systematic change in the peak position is observed for all 17 samples. However, the $A_{1g}$ peak width is seen to consistently reduce after the plasma treatment. Raman data was not collected for all samples in the table illustrated in FIGS. 5A and 5B, however, sample numbers given in the tables illustrates in FIGS. 5A, 5B, and 6 correspond to the same flakes of $MoS_2$.

Figure 7:
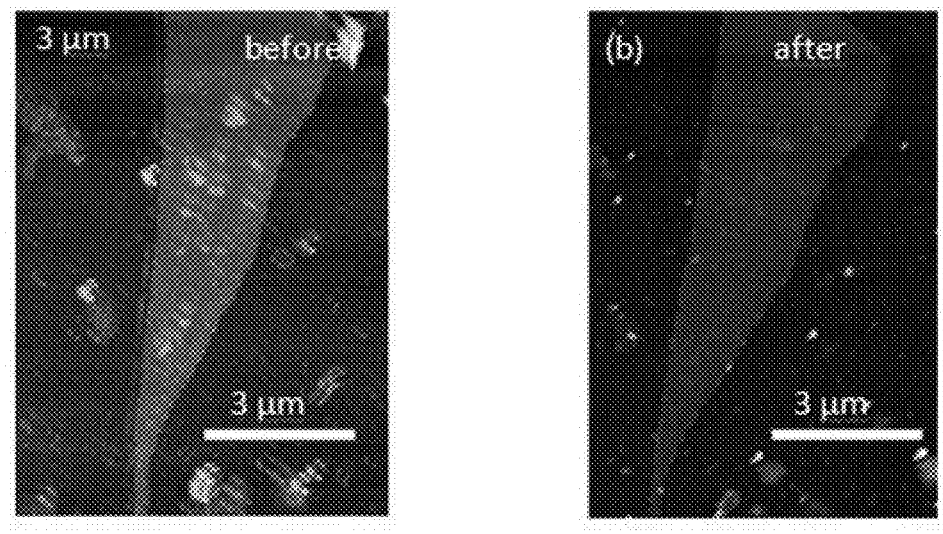
FIG. 7 illustrates AFM images taken before (a) and after (b) 3 minutes of oxygen plasma treatment for a flake of $MoS_2$ indicating a significant reduction in the surface residue due to plasma cleaning.

FIG. 7 illustrates AFM images taken before (a) and after (b) 3 minutes of oxygen plasma treatment for a flake of $MoS_2$ indicating a significant reduction in the surface residue due to plasma cleaning.

PL Enhancement Mechanisms: Layer Decoupling and Removal of Surface Residue

FIG. 8 shows the increase in flake thickness for 12 different many-layer $MoS_2$ flakes. 11 out of 12 flakes show in increase in the thickness after plasma treatment. 10 of these 12 samples showed an increase in the PL intensity. Figure S3 shows the PL enhancement factor plotted as a function of the change in flake thickness for these 10 samples. Two distinct trends are evident in this plot. For the samples indicated in blue, the PL enhancement factor scales linearly with the relative increase in thickness (□h/h), indicating that all of the $MoS_2$ layers are being evenly intercalated. Samples in red, on the other hand, show a universal PL enhancement factor of approximately 2.2× independent of the relative increase in thickness, which we attribute to intercalation only of the top layer.

In FIG. 8, the measured thicknesses of 12 different many-layer $MoS_2$ flakes before and after treatment is shown with remote oxygen plasma, as measured using atomic force microscopy.

TEM and EELS Analysis

To ensure structural integrity of the $MoS_2$ is not disturbed by the oxygen plasma treatment, high resolution transmission electron microscopy was performed. To investigate any change in the charge density of the sample, the plasmon loss peak in the electron energy loss spectrum [R. F. Egerton, *Electron energy-loss spectroscopy in the electron microscope*, Springer, 2011] (EELS) was studied for $MoS_2$ in a transmission electron microscope (TEM). To first order, the unscreened plasmon frequency is defined by the Drude model as $$\omega_p^2 = \frac{ne^2}{m\epsilon_0}.$$

FIG. 9 illustrates correlation of the observed PL enhancement with the relative increase in interlayer separation (Δh/h) showing trend lines corresponding to two types of samples with uniformly intercalated layers (blue) and top-layer only intercalation (red).

A few layer flake of $MoS_2$ was transferred to a TEM grid, using the standard PMMA transfer technique [X. Li, Y. Zhu, W. Cai, M. Borysiak, B. Han, D. Chen, R. D. Piner, L. Colombo, R. S. Ruoff, *Nano Letters* 2009, 9, 4359]. The structural quality of the flake was confirmed using high resolution imaging and electron diffraction at 200 kV, as shown in FIGS. 10(a) and 10(b), and STEM-EELS images were collected on a post column Gatan Imaging Filter Quantum system after successive oxygen plasma steps. EEL spectra obtained are fitted to a Gaussian function to determine the plasmon energy. The shift of the plasmon loss peak is plotted as a function of the oxygen plasma exposure time in FIG. 10(e), showing a consistent increase in plasmon energy, which indicates an increase in charge density in the $MoS_2$. It should be noted that the first data point in this plot is affected by beam induced surface contamination of the $MoS_2$ during our initial high resolution imaging, which required exposure to the beam for a few hours. All subsequent EELS images required considerably shorter exposures to the electron beam. This upshift in the plasmon loss peak indicates about a 1% increase in the density of valence electrons in the sample, which would be explained by partial intercalation with a foreign species having more valence shell electrons than molybdenum. The emergence of the trion state, however, is deemed unlikely with just a 1% modulation of charge density.

Applications

Semiconductor optoelectronic devices have revolutionized technology over the last decade, with the rapid emergence of light emitting diodes (LEDs) and photovoltaic solar cells. Similarly, diode pumped lasers such as vertical cavity surface emitting lasers (VCSELs) are a class of optoelectronic devices which currently form the backbone of the optical communication channels which power the internet. This progress has been enabled by research efforts to enhance the interaction of light (photons) with the semiconducting material and its charge carriers (electrons and holes). In indirect gap semiconductors (such as silicon), the transfer of energy from photons to electrons is inherently inefficient, since it requires the creation of lattice vibration to conserve momentum. However, direct gap semiconductors are not limited by this requirement, and hence, are inherently better suited for efficient optoelectronic devices. However, direct gap semiconductors are not limited by this requirement, and hence, are inherently better suited for efficient optoelectronic devices.

Recently, two dimensional semiconductors such as transition metal dichalcogenides (TMDCs) have been explored as potential semiconductors of for future device application. While single atomic layers of this material are direct gap (and hence desirable for optoelectronics), multiple layer TMDCs are indirect gap, and hence form inefficient optoelectronic devices. Our approach, based on a scalable exposure to remotely generate oxygen plasma, has been shown to convert such multiple layer TMDCs from indirect to direct gap materials through electronic decoupling. This process opens up the possibility of creating efficient optoelectronic devices from multilayer TMDCs desirable for potential future application such as LEDs, lasers, and photovoltaic solar cells.

Recently, two dimensional semiconductors such as transition metal dichalcogenides (TMDCs) have been explored as potential semiconductors of for future device application. While single atomic layers of this material are direct gap (and hence desirable for optoelectronics), multiple layer TMDCs are indirect gap, and hence form inefficient optoelectronic devices. The approach described herein, based on a scalable exposure to remotely generate oxygen plasma, has been shown to convert such multiple layer TMDCs from indirect to direct gap materials through electronic decoupling. This process opens up the possibility of creating efficient optoelectronic devices from multilayer TMDCs desirable for potential future application such as LEDs, lasers, and photovoltaic solar cells.

The components, steps, features, objects, benefits, and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, objects, benefits, and/or advantages. These also include embodiments in which the components and/or steps are arranged and/or ordered differently.

For example, this material could be as a light emitting diode (LED), solid state laser, photodetector, solar cell, field effect transistor (FET), or thermoelectric generator or cooler.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

All articles, patents, patent applications, and other publications that have been cited in this disclosure are incorporated herein by reference.

The phrase "means for" when used in a claim is intended to and should be interpreted to embrace the corresponding structures and materials that have been described and their equivalents. Similarly, the phrase "step for" when used in a claim is intended to and should be interpreted to embrace the corresponding acts that have been described and their equivalents. The absence of these phrases from a claim means that the claim is not intended to and should not be interpreted to be limited to these corresponding structures, materials, or acts, or to their equivalents.

The scope of protection is limited solely by the claims that now follow. That scope is intended and should be interpreted to be as broad as is consistent with the ordinary meaning of the language that is used in the claims when interpreted in light of this specification and the prosecution history that follows, except where specific meanings have been set forth, and to encompass all structural and functional equivalents.

Relational terms such as "first" and "second" and the like may be used solely to distinguish one entity or action from another, without necessarily requiring or implying any actual relationship or order between them. The terms "comprises," "comprising," and any other variation thereof when used in connection with a list of elements in the specification or claims are intended to indicate that the list is not exclusive and that other elements may be included. Similarly, an element preceded by an "a" or an "an" does not, without further constraints, preclude the existence of additional elements of the identical type.

None of the claims are intended to embrace subject matter that fails to satisfy the requirement of Sections 101, 102, or 103 of the Patent Act, nor should they be interpreted in such a way. Any unintended coverage of such subject matter is hereby disclaimed. Except as just stated in this paragraph, nothing that has been stated or illustrated is intended or should be interpreted to cause a dedication of any component, step, feature, object, benefit, advantage, or equivalent to the public, regardless of whether it is or is not recited in the claims.

The abstract is provided to help the reader quickly ascertain the nature of the technical disclosure. It is submitted with the understanding that it will not be used to interpret or limit the scope or meaning of the claims. In addition, various features in the foregoing detailed description are grouped together in various embodiments to streamline the disclosure. This method of disclosure should not be interpreted as requiring claimed embodiments to require more features than are expressly recited in each claim. Rather, as the following claims reflect, inventive subject matter lies in less than all features of a single disclosed embodiment. Thus, the following claims are hereby incorporated into the detailed description, with each claim standing on its own as separately claimed subject matter.

The invention claimed is:

1. A metal dichalcogenide (TMDC) comprising:
metal dichalcogenide flakes having monolayers with oxygen disposed within interlayers thereof, with an increased interlayer separation of at least 0.5 angstrom more than its bulk value such that the metal dichalcogenide has a bulk direct band gap wherein the metal dichalcogenide flakes have 4 to 15 metal dichalcogenide monolayers.

2. The TMDC of claim 1 wherein the TMDC is a bulk direct band gap molybdenum disulfide ($MoS_2$).

3. The TMDC of claim 2 wherein the increased interlayer separation is at least 1 angstrom.

4. The TMDC of claim 2 wherein the increased interlayer separation is at least 3 angstrom.

5. The TMDC of claim 1 wherein the TMDC is a bulk direct band gap tungsten diselenide ($WSe_2$).

6. A device comprising the TMDC of claim 1.

7. The device of claim 6 wherein the device is an optoelectronic device.

8. The device of claim 7 wherein the optoelectronic device is an LED.

9. The device of claim 7 wherein the optoelectronic device is a solid state laser.

10. The device of claim 7 wherein the optoelectronic device is a photodetector.

11. The device of claim 7 wherein the optoelectronic device is a solar cell.

12. The device of claim 7 wherein the optoelectronic device is a FET.

13. The device of claim 7 wherein the optoelectronic device is a thermoelectric generator.

14. The device of claim 7 wherein the optoelectronic device is a thermoelectric cooler.

15. A metal dichalcogenide (TMDC) comprising:
metal dichalcogenide flakes having monolayers with oxygen disposed within interlayers thereof, with an increased interlayer separation of at least 0.5 angstrom more than its bulk value such that the metal dichalcogenide has a bulk direct band gap wherein the TMDC is a bulk direct band gap molybdenum disulfide ($MoS_2$) and wherein the increased interlayer separation is at least 3 angstrom.

16. The TMDC of claim 15 wherein the metal dichalcogenide flakes have 4 to 15 metal dichalcogenide monolayers.

17. A device comprising the TMDC of claim 15.

18. The device of claim 17 wherein the device is an optoelectronic device.

19. The device of claim 18 wherein the optoelectronic device is an LED.

20. The device of claim 18 wherein the optoelectronic device is a solid state laser.

21. The device of claim 18 wherein the optoelectronic device is a photodetector.

22. The device of claim 18 wherein the optoelectronic device is a solar cell.

23. The device of claim 18 wherein the optoelectronic device is a FET.

24. The device of claim 18 wherein the optoelectronic device is a thermoelectric generator.

25. The device of claim 18 wherein the optoelectronic device is a thermoelectric cooler.

26. A metal dichalcogenide (TMDC) comprising:
metal dichalcogenide flakes having monolayers with oxygen disposed within interlayers thereof, with an increased interlayer separation of at least 0.5 angstrom more than its bulk value such that the metal dichalcogenide has a bulk direct band gap wherein the TMDC is a bulk direct band gap tungsten diselenide ($WSe_2$).

27. The TMDC of claim 26 wherein the metal dichalcogenide flakes have 4 to 15 metal dichalcogenide monolayers.

28. A device comprising the TMDC of claim 26.

29. The device of claim 28 wherein the device is an optoelectronic device.

30. The device of claim 29 wherein the optoelectronic device is an LED.

31. The device of claim 29 wherein the optoelectronic device is a solid state laser.

32. The device of claim 29 wherein the optoelectronic device is a photodetector.

33. The device of claim 29 wherein the optoelectronic device is a solar cell.

34. The device of claim 29 wherein the optoelectronic device is a FET.

35. The device of claim 29 wherein the optoelectronic device is a thermoelectric generator.

36. The device of claim 29 wherein the optoelectronic device is a thermoelectric cooler.

* * * * *

UNITED STATES PATENT AND TRADEMARK OFFICE
CERTIFICATE OF CORRECTION

PATENT NO. : 10,680,403 B2
APPLICATION NO. : 15/536628
DATED : June 9, 2020
INVENTOR(S) : Cronin et al.

Page 1 of 1

It is certified that error appears in the above-identified patent and that said Letters Patent is hereby corrected as shown below:

In the Claims

Column 14, Lines 2-3, Claim 15:
After "wherein the TMDC is a"
Delete "hulk" and
Insert -- bulk --.

Column 14, Lines 29-30, Claim 26:
After "at least 0.5 angstrom more than its"
Delete "hulk" and
Insert -- bulk --.

Column 14, Lines 30-31, Claim 26:
After "the metal dichalcogenide has a"
Delete "hulk" and
Insert -- bulk --.

Signed and Sealed this
Fifteenth Day of February, 2022

Drew Hirshfeld
*Performing the Functions and Duties of the*
*Under Secretary of Commerce for Intellectual Property and*
*Director of the United States Patent and Trademark Office*